(12) United States Patent
Liu et al.

(10) Patent No.: US 11,854,941 B2
(45) Date of Patent: Dec. 26, 2023

(54) METHOD FOR PACKAGING SEMICONDUCTOR, SEMICONDUCTOR PACKAGE STRUCTURE, AND PACKAGE

(71) Applicant: CHANGXIN MEMORY TECHNOLOGIES, INC., Hefei (CN)

(72) Inventors: Jie Liu, Hefei (CN); Zhan Ying, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 247 days.

(21) Appl. No.: 17/372,541

(22) Filed: Jul. 12, 2021

(65) Prior Publication Data
US 2021/0343625 A1    Nov. 4, 2021

Related U.S. Application Data

(63) Continuation of application No. PCT/CN2020/096255, filed on Jun. 16, 2020.

(30) Foreign Application Priority Data

Oct. 16, 2019    (CN) .......................... 201910982066.8

(51) Int. Cl.
*H01L 23/48*    (2006.01)
*H01L 21/78*    (2006.01)
(Continued)

(52) U.S. Cl.
CPC ............ *H01L 23/481* (2013.01); *H01L 21/78* (2013.01); *H01L 24/16* (2013.01); *H01L 24/97* (2013.01);
(Continued)

(58) Field of Classification Search
CPC ....... H01L 23/481; H01L 21/78; H01L 24/16; H01L 24/97; H01L 25/0657; H01L 25/50;
(Continued)

(56) References Cited

U.S. PATENT DOCUMENTS 6,492,726 B1    12/2002    Quek et al.
2010/0102428 A1    4/2010    Lee et al.
(Continued)

FOREIGN PATENT DOCUMENTS

CN    102646663 A    8/2012
CN    103718289 B    2/2017
(Continued)

*Primary Examiner* — Timor Karimy
(74) *Attorney, Agent, or Firm* — KILPATRICK TOWNSEND & STOCKTON LLP

(57) ABSTRACT

Embodiments provide a method for packaging a semiconductor, a semiconductor package structure, and a package. The method includes: providing a substrate wafer having a first surface and a second surface arranged opposite to each other, the first surface having a plurality of grooves, a plurality of electrically conductive pillars being provided at a bottom of the groove, and the electrically conductive pillar penetrating through the bottom of the groove to the second surface; providing a plurality of semiconductor die stacks; placing the semiconductor die stack in the groove; and covering a cover plate wafer on the first surface of the substrate wafer to seal up the groove so as to form a semiconductor package structure, a gap between the substrate wafer, the semiconductor die stack and the cover plate wafer being not filled with a filler.

14 Claims, 6 Drawing Sheets

(51) Int. Cl.
  *H01L 25/065* (2023.01)
  *H01L 23/00* (2006.01)
  *H01L 25/00* (2006.01)

(52) U.S. Cl.
  CPC .......... *H01L 25/0657* (2013.01); *H01L 25/50* (2013.01); *H01L 24/94* (2013.01); *H01L 2224/16148* (2013.01); *H01L 2224/16221* (2013.01); *H01L 2225/06513* (2013.01); *H01L 2225/06517* (2013.01); *H01L 2225/06541* (2013.01); *H01L 2225/06548* (2013.01); *H01L 2225/06586* (2013.01); *H01L 2924/3511* (2013.01)

(58) Field of Classification Search
  CPC .......... H01L 24/94; H01L 2224/16148; H01L 2224/16221; H01L 2924/3511; H01L 2225/06513; H01L 2225/06517; H01L 2225/06541; H01L 2225/06548; H01L 2225/06586; H10B 80/00
  See application file for complete search history.

(56) References Cited

U.S. PATENT DOCUMENTS

| 2016/0181218 | A1* | 6/2016 | Karhade | H01L 25/18 257/737 |
| 2017/0317019 | A1 | 11/2017 | Shen et al. | |
| 2019/0221547 | A1* | 7/2019 | Drab | H01L 21/50 |

FOREIGN PATENT DOCUMENTS

| CN | 107408546 | * | 11/2017 |
| CN | 107408546 | A | 11/2017 |
| CN | 108630625 | A | 10/2018 |
| CN | 210272259 | U | 4/2020 |

* cited by examiner

METHOD FOR PACKAGING SEMICONDUCTOR, SEMICONDUCTOR PACKAGE STRUCTURE, AND PACKAGE

CROSS-REFERENCE TO RELATED APPLICATION

This application is a continuation of PCT/CN2020/096255, filed on Jun. 16, 2020, which claims priority to Chinese Patent Application No. 201910982066.8, titled "METHOD FOR PACKAGING SEMICONDUCTOR, SEMICONDUCTOR PACKAGE STRUCTURE, AND PACKAGE" and filed on Oct. 16, 2019, the entire contents of which are incorporated herein by reference.

FIELD OF THE INVENTION

The present disclosure relates to the field of semiconductor package, and more particularly, to a method for packaging a semiconductor, a semiconductor package structure, and a package.

BACKGROUND OF THE INVENTION

Also known as a 3D or three-dimensional packaging technology, a stacked packaging technology is one of current mainstream multi-chip packaging technologies, which can stack at least two semiconductor chips (also referred to as dies, i.e., blocks having full functions diced from a wafer). The stacked packaging technology is generally employed to manufacture electronic components such as memory chips, logic chips, and processor chips. With the development of the electronics industry, there are increasing requirements of the electronic components for high capacity, high function, high speed and small size. To meet the requirements, it is necessary to integrate more chips in a single package, which may increase a package height of the electronic components and reduce reliability, thus having a negative effect on the performance of the package structure.

Therefore, how to reduce the package height of the package and improve the reliability of the package has become a technical problem urgently needing to be solved at present.

SUMMARY OF THE INVENTION

A technical problem to be solved by the present disclosure is to provide a method for packaging a semiconductor, a semiconductor package structure, and a package. The present disclosure is characterized by a lower package height, a higher reliability, and a lower warpage.

To solve the above problem, the present disclosure provides a method for packaging a semiconductor. The method includes followings steps. A substrate wafer is provided, which has a first surface and a second surface arranged opposite to each other. The first surface has a plurality of grooves, a plurality of electrically conductive pillars are provided at a bottom of the groove, and the electrically conductive pillar penetrates through the bottom of the groove to the second surface. A plurality of semiconductor die stacks is provided and placed in the groove. An upper surface of the semiconductor die stack is lower than or flush with an upper edge of the groove, and a bottom of the semiconductor die stack is electrically connected to the electrically conductive pillar. A cover plate wafer is covered on the first surface of the substrate wafer to seal up the groove so as to form a semiconductor package structure. A gap between the substrate wafer, the semiconductor die stack and the cover plate wafer are filled with air or vacuum.

Further, the second surface of the substrate wafer has a plurality of electrically conductive blocks, and the electrically conductive blocks are electrically connected to the electrically conductive pillars.

Further, the method of forming a groove on the substrate wafer includes: planarizing the first surface of the substrate wafer; and removing a part of the substrate wafer from the first surface until the electrically conductive pillar is exposed to form the groove.

Further, the substrate wafer has dicing lanes, and the dicing lanes are used for alignment to form the groove.

Further, the semiconductor die stack is formed by stacking a plurality of semiconductor dies electrically connected to each other, and the plurality of semiconductor dies is electrically connected to the electrically conductive pillars through the bottom of the semiconductor die stack.

Further, the semiconductor dies are electrically connected to each other through the electrically conductive pillar penetrating through each of the semiconductor dies and the electrically conductive block between the adjacent semiconductor dies.

Further, the bottom of the semiconductor die stack is electrically connected to the electrically conductive pillar penetrating through the bottom of the groove through the electrically conductive block.

Further, a surface of the cover plate wafer facing toward the substrate wafer has a plurality of electrically conductive pillars, and the electrically conductive pillar is electrically connected to the upper surface of the semiconductor die stack.

Further, after the step of sealing up the plurality of grooves, the method also includes a dicing step: dicing the semiconductor package structure along gaps between the plurality of grooves to form a plurality of packages independent of each other.

The present disclosure also provides a semiconductor package structure, which includes a substrate wafer having a first surface and a second surface arranged opposite to each other. The first surface has a plurality of grooves, a plurality of electrically conductive pillars is provided at a bottom of the groove, and the electrically conductive pillar penetrates through the bottom of the groove to the second surface. Moreover, the semiconductor package structure includes a plurality of semiconductor die stacks placed in the groove, wherein an upper surface of the semiconductor die stack is lower than or flush with an upper edge of the groove, and a bottom of the semiconductor die stack is electrically connected to the electrically conductive pillar. Furthermore, the semiconductor package structure also includes a cover plate wafer covered on the first surface of the substrate wafer to seal up the groove so as to form a groove. A gap between the substrate wafer, the semiconductor die stack and the cover plate wafer are filled with air or vacuum.

Further, the second surface of the substrate wafer has a plurality of electrically conductive blocks electrically connected to the electrically conductive pillars.

Further, the semiconductor die stack is formed by stacking a plurality of semiconductor dies electrically connected to each other, and the semiconductor dies are electrically connected to the electrically conductive pillars through the bottom of the semiconductor die stack.

Further, the semiconductor dies are electrically connected to each other through the electrically conductive pillar penetrating through each of the semiconductor dies and the electrically conductive block between the adjacent semiconductor dies.

Further, the bottom of the semiconductor die stack is electrically connected to the electrically conductive pillar penetrating through the bottom of the groove through the electrically conductive block.

Further, a surface of the cover plate wafer facing toward the substrate wafer has a plurality of electrically conductive pillars electrically connected to the upper surface of the semiconductor die stack.

The present disclosure also provides a package, which includes a substrate having a first surface and a second surface arranged opposite to each other. The first surface having a plurality of grooves, a plurality of electrically conductive pillars are provided at a bottom of the groove, and the electrically conductive pillar penetrates through the bottom of the groove to the second surface. Moreover, the package includes at least one semiconductor die stack placed in the groove, wherein an upper surface of the semiconductor die stack is lower than or flush with an upper edge of the groove, and a bottom of the semiconductor die stack is electrically connected to the electrically conductive pillar. Furthermore, the package also includes a cover plate covered on the first surface of the substrate to seal up the groove. A gap between the substrate, the semiconductor die stack and the cover plate are filled with air or vacuum.

Advantages of the present disclosure are as below. A groove is formed on the substrate wafer to accommodate the semiconductor die stack, and the semiconductor die stack is sealed up by a cover plate wafer. In this way, the height of the semiconductor package structure can be greatly reduced while the same number of semiconductor dies is packaged, such that ultra-thin packaging can be achieved. Furthermore, the gap between the substrate wafer, the semiconductor die stack and the cover plate wafer is not filled with the filler. Instead, the groove is sealed up merely by using the cover plate wafer, and then the semiconductor die stack is sealed up. In this way, it can be solved the problem of reliability and the problem of warpage caused by deformation of the semiconductor package structure due to mismatch between an expansion coefficient of the filler and an expansion coefficient of the substrate wafer and mismatch between an expansion coefficient of the semiconductor die stack and an expansion coefficient of the cover plate wafer. Therefore, the semiconductor package structure formed by using the method for packaging a semiconductor provided by the present disclosure has a better reliability and a lower warpage.

DETAILED DESCRIPTION OF THE EMBODIMENTS

Embodiments of a method for packaging a semiconductor, a semiconductor package structure and a package provided by the present disclosure are described below in detail with reference to the accompanying drawings.

Figure 1:
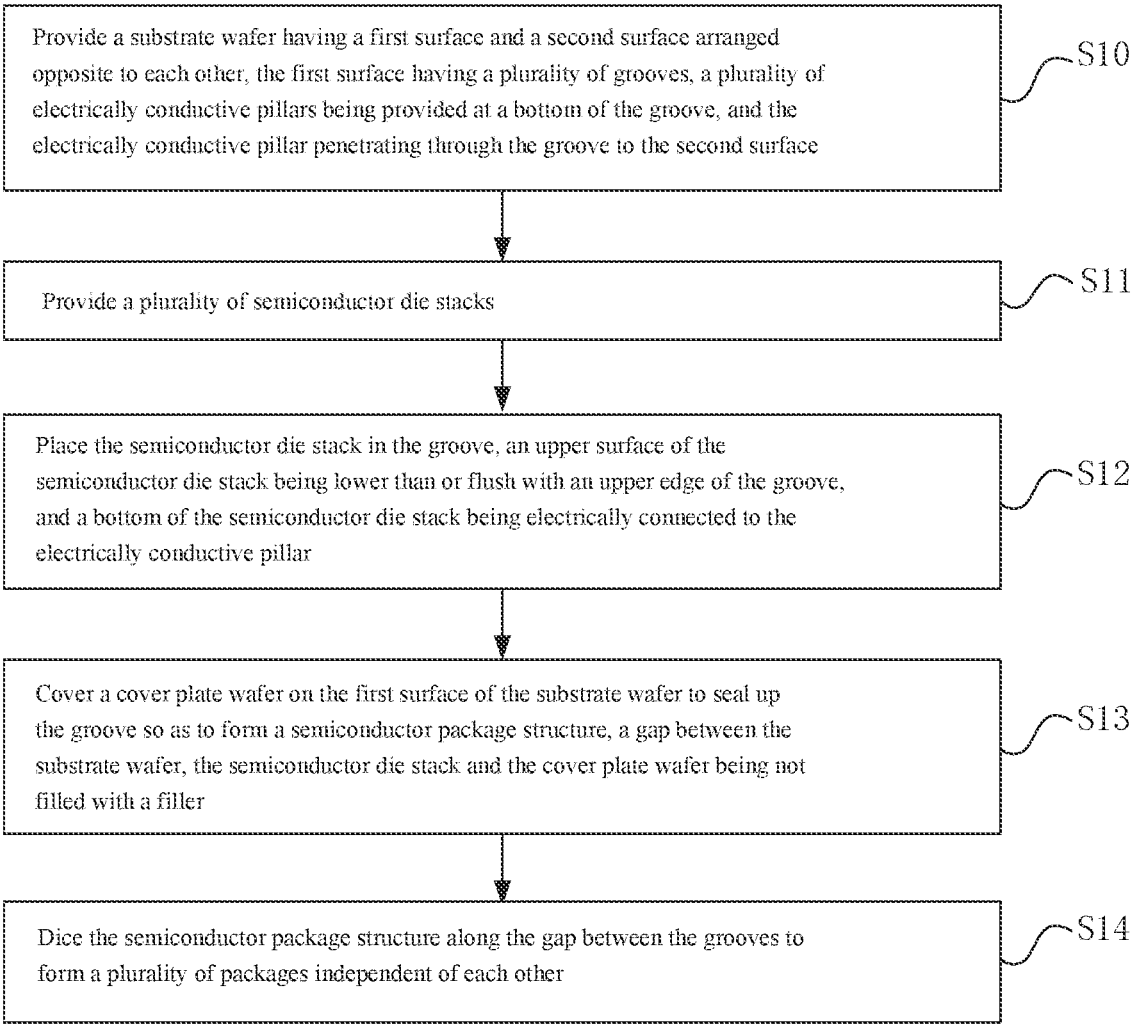
FIG. 1 is a schematic diagram showing steps of a method for packaging a semiconductor according to an embodiment of the present disclosure.

FIG. 1 is a schematic diagram showing steps of the method for packaging a semiconductor according to an embodiment of the present disclosure. With reference to FIG. 1, the method for packaging a semiconductor includes following steps. In Step S10, a substrate wafer is provided, and the substrate wafer has a first surface and a second surface arranged opposite to each other, wherein the first surface has a plurality of grooves, a plurality of electrically conductive pillars is provided at a bottom of the groove, and the electrically conductive pillar penetrates through the bottom of the groove to the second surface. In Step S11, a plurality of semiconductor die stacks is provided. In Step S12, the semiconductor die stack is placed in the groove, wherein an upper surface of the semiconductor die stack is lower than or flush with an upper edge of the groove, and a bottom of the semiconductor die stack is electrically connected to the electrically conductive pillar. In Step S13, a cover plate wafer is covered on the first surface of the substrate wafer to seal up the groove so as to form a semiconductor package structure. A gap between the substrate wafer, the semiconductor die stack and the cover plate wafer is not filled with a filler. In Step S14, the semiconductor package structure is diced along the gap between the grooves to form a plurality of packages independent of each other.

FIG. 2A-FIG. 2G are schematic flow diagrams of the method for packaging a semiconductor according to an embodiment of the present disclosure.

Figure 2A:
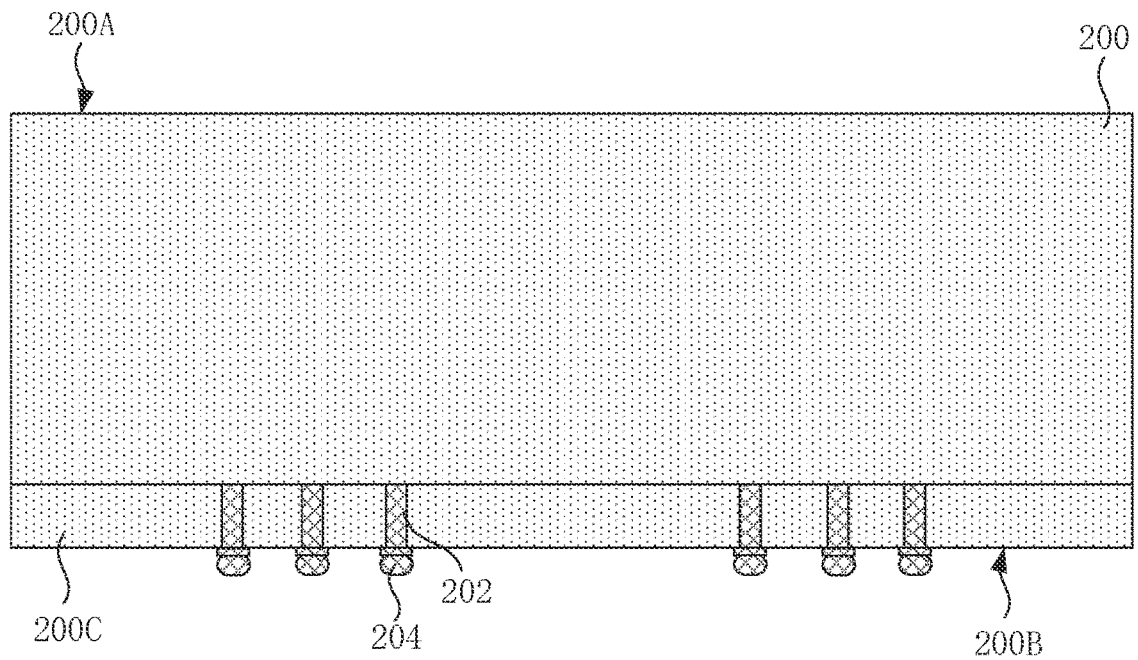
FIG. 2A-FIG. 2G are schematic flow diagrams of the method for packaging a semiconductor according to an embodiment of the present disclosure.
Figure 2B:
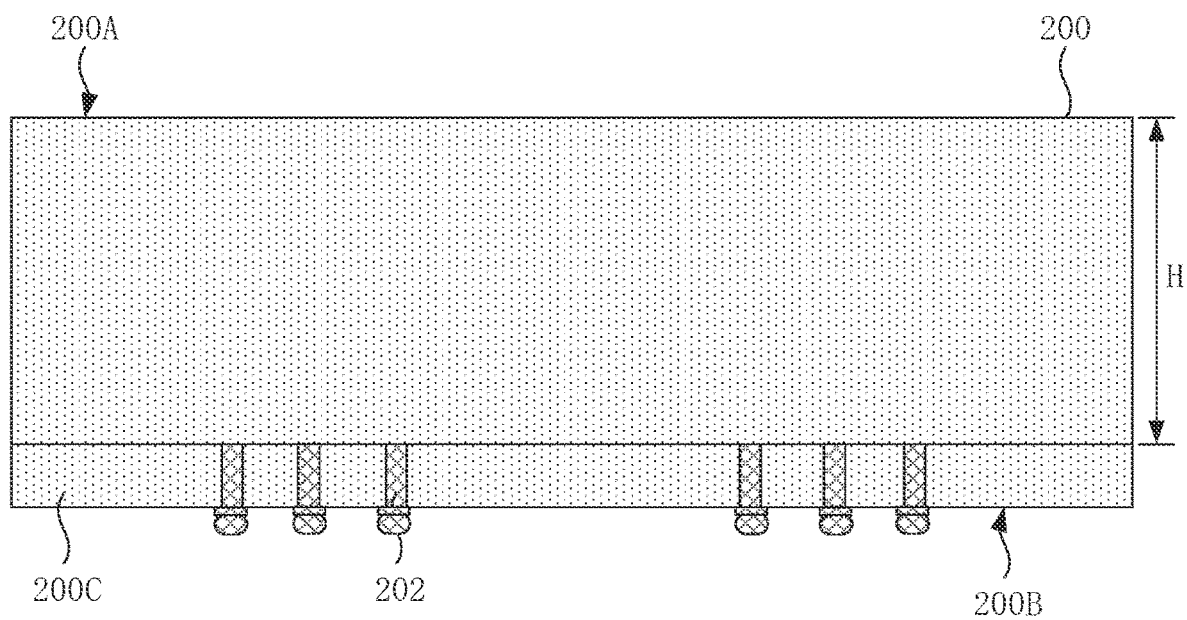
Figure 2C:
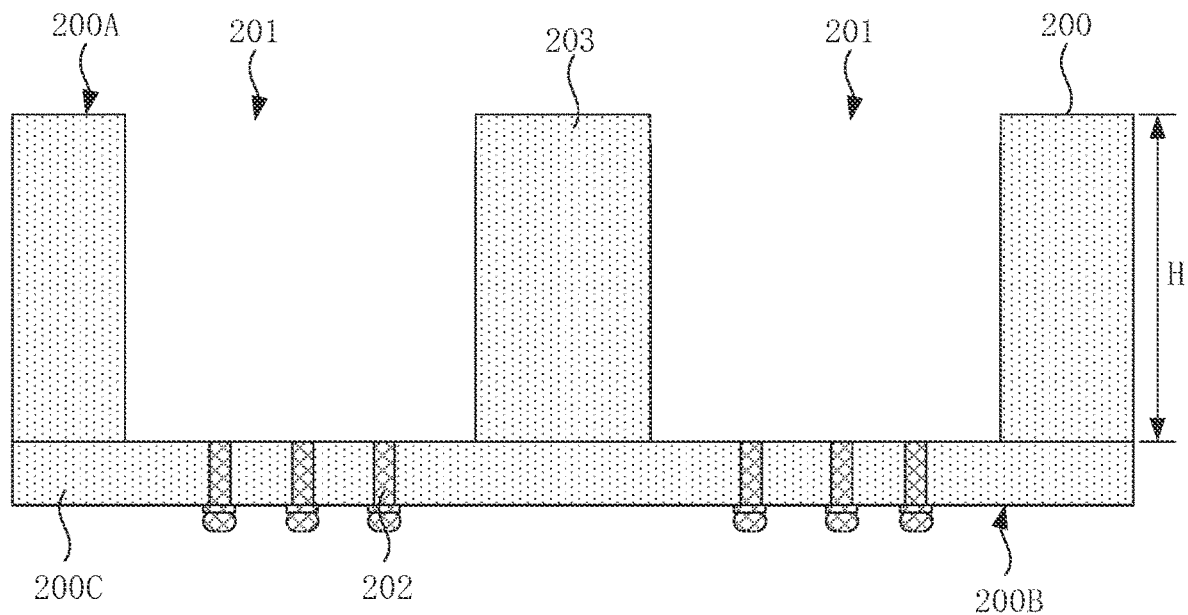

Referring to Step S10 and FIG. 2C, a substrate wafer 200 is provided, and the substrate wafer 200 has a first surface 200A and a second surface 200B arranged opposite to each other. The first surface 200A has a plurality of grooves 201, a plurality of electrically conductive pillars 202 are provided at a bottom of the groove 201, and the electrically conductive pillar 202 penetrates through the bottom of the groove 201 to the second surface 200B.

An embodiment of forming the groove 201 is described below by way of illustration.

Referring to FIG. 2A, the substrate wafer 200 has a first surface 200A and a second surface 200B arranged opposite to each other. The first surface 200A is a back surface of the substrate wafer 200, and the second surface 200B is a front surface of the substrate wafer 200. That is, on the second surface 200B, the substrate wafer 200 has a functional layer 200C. The electrically conductive pillar 202 extends from the second surface 200B into the substrate wafer 200, and the surface of the electrically conductive pillar 202 is exposed to the second surface 200B. The electrically conductive pillar 202 not only can play a role of conducting electricity, but also can play a role of conducting heat.

Referring to FIG. 2B, the first surface 200A of the substrate wafer 200 is planarized to facilitate subsequent processes. Further, the first surface 200A of the substrate wafer 200 may be planarized by using a chemical mechanical polishing method. In this step, a thickness of the substrate wafer 200 is reduced. It is to be noted that after this step is performed, a distance H from the first surface 200A of the substrate wafer 200 to the functional layer 200C of the second surface 200B is greater than or equal to a height of the semiconductor die stack 210 to provide sufficient operation space for the subsequent processes.

Referring to FIG. 2C, a part of the substrate wafer 200 is removed from the first surface 200A until the electrically conductive pillar 202 is exposed to form the groove 201. In this step, a photolithography and etching process may be employed to remove a part of the substrate wafer 200, and the etching is not stopped until the electrically conductive pillar 202 is exposed at the bottom of the groove 201. Further, when the etching is about to be stopped, etching conditions may be adjusted to ensure that an edge etching rate of the groove 201 is smaller than an etching rate of a middle part of the groove 201, such that a bottom corner of the groove 201 is shaped like an arc, which can enhance the stability of the side wall of the groove 201.

Further, in this step, the substrate wafer 200 has a dicing lane 203. As shown in FIG. 2C, the groove 201 is formed when the dicing lane 203 passes through the gap between two adjacent grooves 201. The dicing lane 203 may serve as an alignment mark for forming the groove 201. In this way, the accuracy of forming the groove 201 is improved, and there is no need to make additional alignment marks, such that process steps are saved, and production efficiency is improved.

The above embodiment is an embodiment of forming the groove 201 on the first surface 200A of the substrate wafer 200. In other embodiments of the present disclosure, other methods may also be employed to form the groove 201 on the first surface 200A of the substrate wafer 200.

In this embodiment, the width of the dicing lane 203 is equal to the distance between two grooves 201. In other embodiments of the present disclosure, the groove 201 may occupy a part of space of the dicing lane 203, such that the distance between the two adjacent grooves 201 is smaller than the width of the dicing lane 203, which makes it easier to place the semiconductor die stack 210 into the groove 201 subsequently. Furthermore, a side surface of the semiconductor die stack 210 can be prevented from touching the sidewall of the groove 201, and thus it is avoidable to have a negative effect on the performance of the semiconductor die stack 210.

Further, with continued reference to FIG. 2A, a plurality of electrically conductive blocks 204 is provided on the second surface 200B of the substrate wafer 200, and the electrically conductive block 204 is electrically connected to the electrically conductive pillar 202 to electrically connect the electrically conductive pillar 202 to an external device such as a printed circuit board. The electrically conductive block 204 may be formed on the second surface 200B of the substrate wafer 200 before the groove 201 is formed.

Figure 2D:
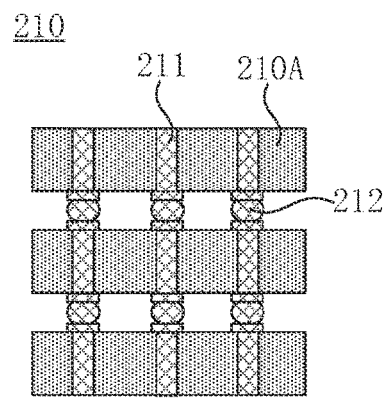

Referring to Step S11 and FIG. 2D, a plurality of semiconductor die stacks 210 is provided. The number of the semiconductor die stacks 210 may be equal to that of the grooves 201, or the number of the semiconductor die stacks 210 may be more than that of the grooves 201. In one embodiment, if the number of the semiconductor die stacks 210 is equal to that of the grooves 201, in the subsequent processes, one semiconductor die stack 210 is placed in one groove 201. If the number of the semiconductor die stacks 210 is more than that of the grooves 201, two or more semiconductor die stacks 210 may be placed in parallel in one groove 201.

The semiconductor die stack 210 is formed by stacking a plurality of semiconductor dies 210A. In this embodiment, three semiconductor dies 210A are schematically shown. The three semiconductor dies 210A are sequentially stacked to form the semiconductor die stack 210. In the semiconductor die stack 210, the semiconductor dies 210A are electrically connected to each other, such that an electrical signal of the semiconductor die 210A can be transmitted to an external structure. In this embodiment, the semiconductor dies 210A are electrically connected to each other through the electrically conductive pillar 211 penetrating through each of the semiconductor dies and the electrically conductive block 212 between the adjacent semiconductor dies. The method of forming the electrically conductive pillar on the semiconductor die 210A includes but is not limited to a through silicon via (TSV) process well known in the art.

After this step is completed, a surface of the electrically conductive pillar is exposed at the bottom of the semiconductor die stack 210, and the surface of the electrically conductive pillar is also exposed at the top of the semiconductor die stack 210.

Figure 2E:
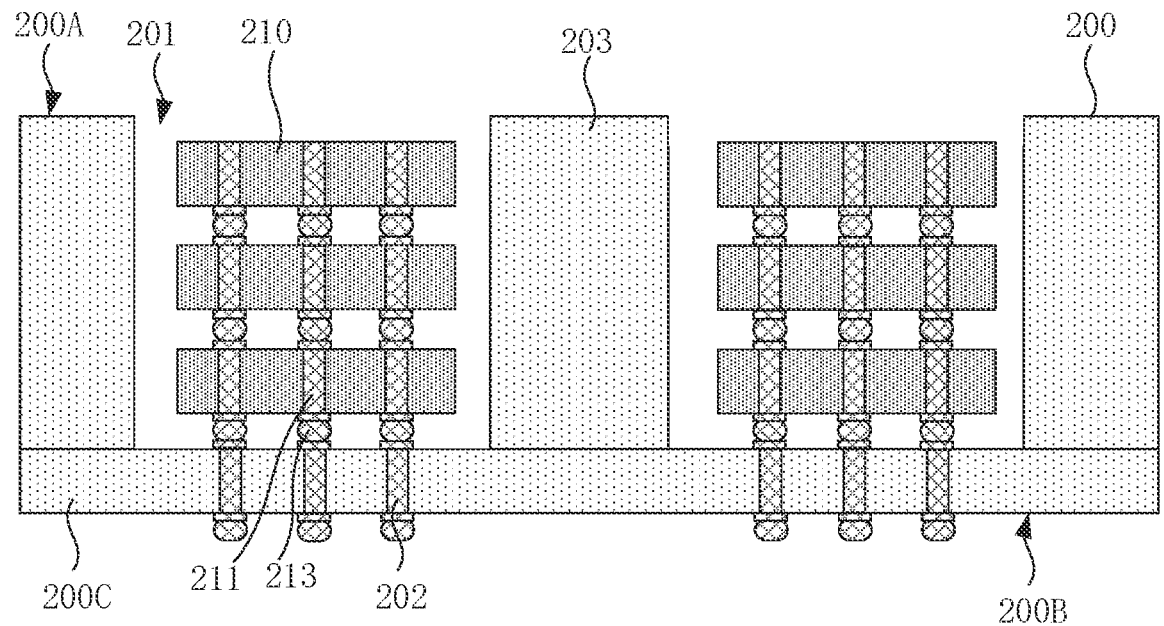

With reference to Step S12 and FIG. 2E, the semiconductor die stack 210 is placed in the groove 201. In this step, one or more semiconductor die stacks 210 may be placed in one of the grooves 201. In this embodiment, one semiconductor die stack 210 is placed in one groove 201.

The bottom of the semiconductor die stack 210 is electrically connected to the electrically conductive pillar 202 penetrating through the bottom of the groove 201. That is, the electrically conductive pillar 211 exposed at the bottom of the semiconductor die stack 210 is electrically connected to the electrically conductive pillar 202 exposed at the bottom of the groove 201. In one embodiment, the electrically conductive pillar 211 and the electrically conductive pillar 202 may be electrically connected through the electrically conductive block 213.

The upper surface of the semiconductor die stack 210 is lower than or flush with the upper edge of the groove 201 to facilitate subsequent processes. In this embodiment, the upper surface of the semiconductor die stack 210 is lower than the upper edge of the groove 201.

Figure 2F:
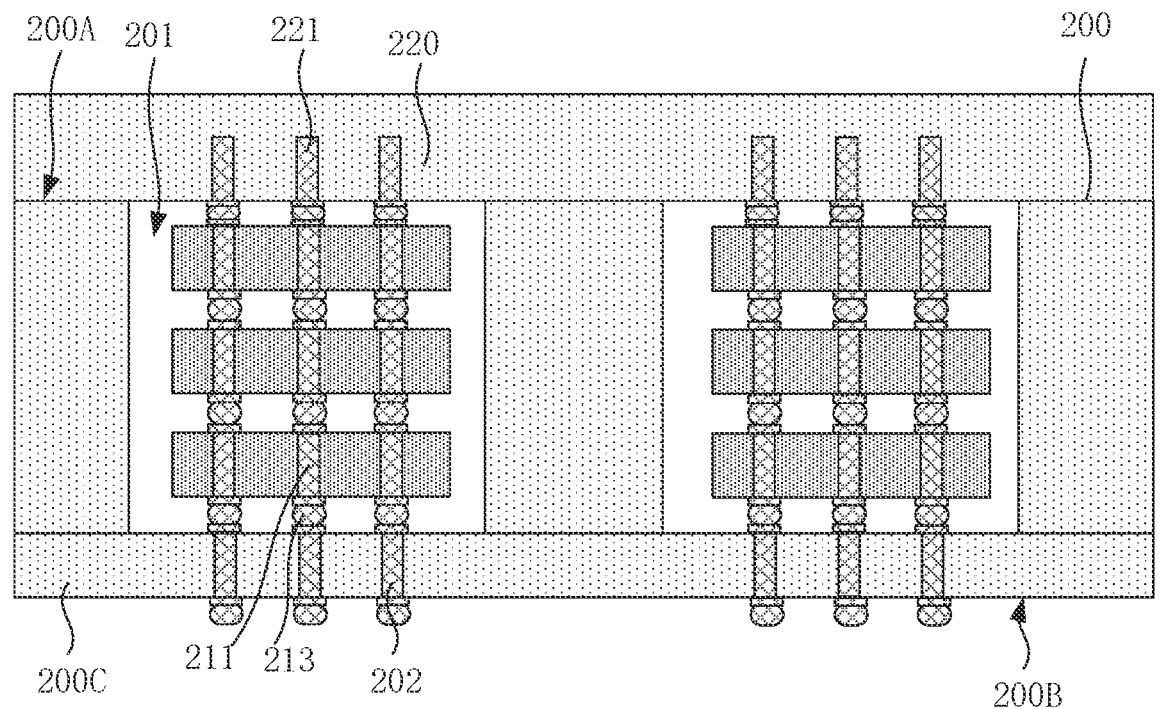
Figure 2G:
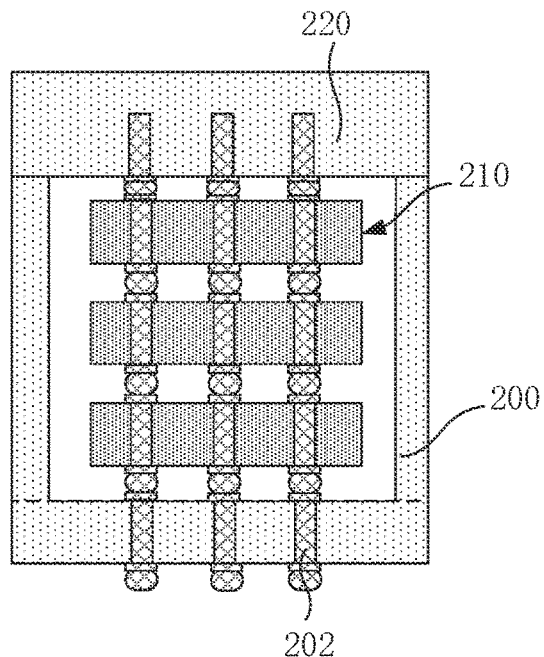

With reference to Step S13 and FIG. 2F, a cover plate wafer 220 is covered on the first surface 200A of the substrate wafer 200 to seal up the groove 201 so as to form a semiconductor package structure. After this step is performed, interior space of the groove 201 is confined space. The cover plate wafer 220 and the substrate wafer 200 may be combined by a bonding process, such that the groove 201 is sealed up.

According to the method for packaging a semiconductor provided by the present disclosure, a groove is formed on the substrate wafer to accommodate the semiconductor die stack, and the semiconductor die stack is sealed up by a cover plate wafer. In this way, the height of the semiconductor package structure can be greatly reduced while the same number of semiconductor dies is packaged, such that ultra-thin packaging can be achieved. Furthermore, the gap between the substrate wafer 200, the semiconductor die stack 210 and the cover plate wafer 220 is not filled with the filler. Instead, the groove 201 is sealed up merely by using the cover plate wafer 220, and then the semiconductor die stack 210 is sealed up. In this way, it can be solved the problem of reliability caused by deformation of the semiconductor package structure due to mismatch between an expansion coefficient of the filler and an expansion coefficient of the substrate wafer and mismatch between an expansion coefficient of the semiconductor die stack and an expansion coefficient of the cover plate wafer. Therefore, the semiconductor package structure formed by using the method for packaging a semiconductor provided by the present disclosure has a good reliability.

Further, a surface of the cover plate wafer 220 facing toward the substrate wafer 200 has a plurality of electrically conductive pillars 221 electrically connected to the upper surface of the semiconductor die stack 210. That is, the electrically conductive pillar 221 on the surface of the cover plate wafer 220 is electrically connected to the electrically conductive pillar 211 exposed on the upper surface of the semiconductor die stack 210. The cover plate wafer 220 can provide heat conduction to the semiconductor die stack 210 through the electrically conductive pillar 221 and can further fix the semiconductor die stack 210. In addition, in the semiconductor packaging, other wafers may also be stacked on the cover plate wafer 220, and the electrically conductive pillar 221 may function as electrical connection.

Alternatively, in this embodiment, after Step S13 is performed, the present disclosure also includes a dicing step. With reference to Step S14 and FIG. 2G the semiconductor package structure is diced along the gap between the grooves 201 to form a plurality of packages independent of each other. In one embodiment, the semiconductor package structure is diced along the dicing lane 203 between the grooves 201 to form a plurality of packages independent of each other. The dicing method includes but is not limited to mechanical dicing, laser dicing and the like.

Figure 3:
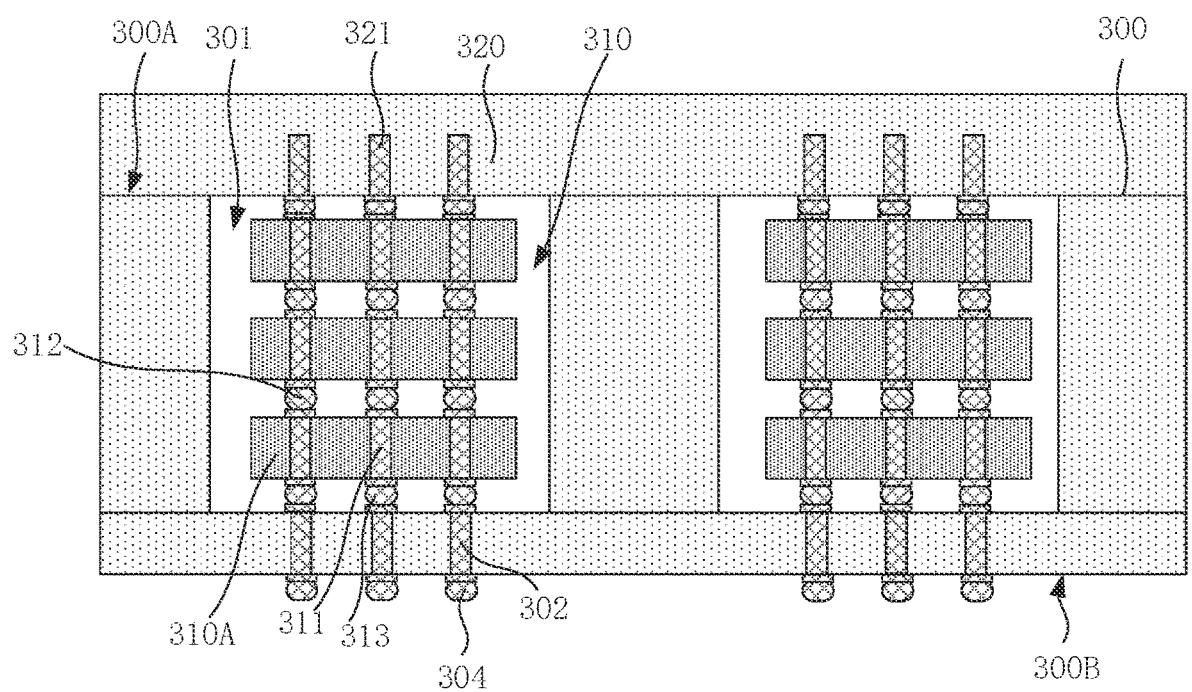
FIG. 3 is a schematic structural diagram of a semiconductor package structure according to an embodiment of the present disclosure.

The present disclosure also provides a semiconductor package structure formed by using the above-mentioned method for packaging a semiconductor. FIG. 3 is a schematic structural diagram of the semiconductor package structure according to an embodiment of the present disclosure. With reference to FIG. 3, the semiconductor package structure includes a substrate wafer 300, a plurality of semiconductor die stacks 310, and a cover plate wafer 320.

The substrate wafer 300 has a first surface 300A and a second surface 300B arranged opposite to each other. The first surface 300A has a plurality of grooves 301, a plurality of electrically conductive pillars 302 are provided at a bottom of the groove 301, and the electrically conductive pillar 302 penetrates through the bottom of the groove 301 to the second surface 300B. The second surface 300B of the substrate wafer 300 has a plurality of electrically conductive blocks 304 electrically connected to the electrically conductive pillars 302.

The semiconductor die stack 310 is placed in the groove 301, and an upper surface of the semiconductor die stack 310 is lower than or flush with an upper edge of the groove 301. In this embodiment, the upper surface of the semiconductor die stack 310 is lower than the upper edge of the groove 301. A bottom of the semiconductor die stack 310 is electrically connected to the electrically conductive pillar 302. The semiconductor die stack 310 is formed by stacking a plurality of semiconductor dies 310A, the semiconductor dies 310A may be electrically connected to each other through the electrically conductive pillar 311 penetrating through each of the semiconductor dies 310A and the electrically conductive block 312 between the adjacent semiconductor dies 310A, and may be electrically connected to the electrically conductive pillar 302 through the bottom of the semiconductor die stack 310. The bottom of the semiconductor die stack 310 may be electrically connected to the electrically conductive pillar 302 through the electrically conductive block 313.

The cover plate wafer 320 is covered the first surface 300A of the substrate wafer 300 to seal up the groove 301. A gap between the substrate wafer 300, the semiconductor die stack 310 and the cover plate wafer 320 is not filled with a filler. Further, a surface of the cover plate wafer 320 facing toward the substrate wafer 300 has a plurality of electrically conductive pillars 321 electrically connected to the upper surface of the semiconductor die stack 310. In one embodiment, the electrically conductive pillar 321 is electrically connected to the electrically conductive pillar 311 exposed on the upper surface of the semiconductor die stack 310. The cover plate wafer 300 can provide heat conduction to the semiconductor die stack 310 through the electrically conductive pillar 321 and can further fix the semiconductor die stack 310. In addition, in the semiconductor packaging, other wafers may also be stacked on the cover plate wafer 300, and the electrically conductive pillar 321 may function as electrical connection.

In the semiconductor package structure provided by the present disclosure, a groove is formed on the substrate wafer to accommodate the semiconductor die stack, and the groove is sealed up by the cover plate wafer. In this way, the height of the semiconductor package structure can be greatly reduced, such that ultra-thin packaging can be achieved. Furthermore, the gap between the substrate wafer, the semiconductor die stack and the cover plate wafer is not filled with the filler. Instead, the groove is sealed up merely by using the cover plate wafer, and then the semiconductor die stack is sealed up. In this way, it can be solved the problem of reliability of the semiconductor package structure caused by mismatch between an expansion coefficient of the filler and an expansion coefficient of the substrate wafer and mismatch between an expansion coefficient of the semiconductor die stack and an expansion coefficient of the cover plate wafer. Therefore, the semiconductor package structure provided by the present disclosure has good reliability.

Figure 4:
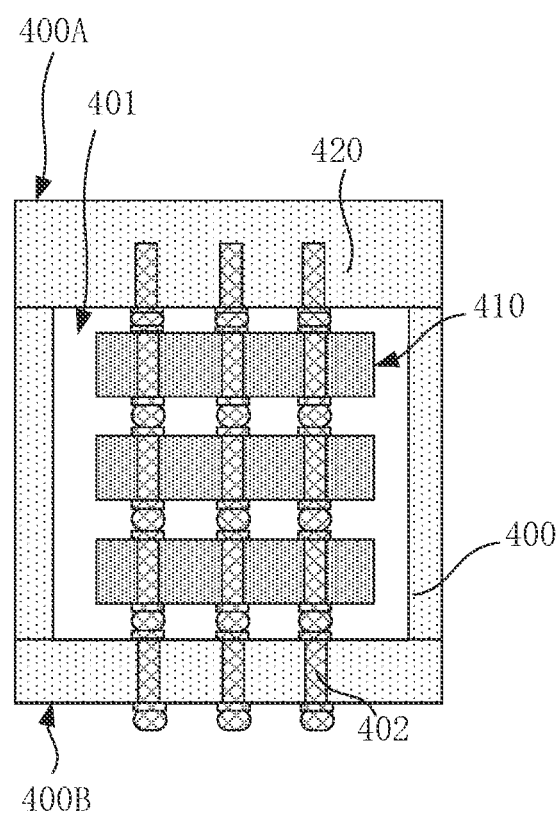
FIG. 4 is a schematic structural diagram of a package according to an embodiment of the present disclosure.

The present disclosure also provides a package. FIG. 4 is a schematic structural diagram of the package according to an embodiment of the present disclosure. With reference to FIG. 4, the package is formed by dicing the above-mentioned semiconductor package structure along the dicing lane between the grooves. The package includes a substrate 400, at least one semiconductor die stack 410, and a cover plate 420.

The substrate 400 has a first surface 400A and a second surface 400B arranged opposite to each other. The first surface 400A has at least one groove 401, a plurality of electrically conductive pillars 402 is provided at a bottom of the groove 401, and the electrically conductive pillar 402 penetrates through the bottom of the groove 401 to the second surface 400B.

The semiconductor die stack 410 is placed in the groove 401, an upper surface of the semiconductor die stack 410 is lower than or flush with an upper edge of the groove 401, and a bottom of the semiconductor die stack 410 is electrically connected to the electrically conductive pillar 402.

The cover plate 420 is covered on the first surface 400A of the substrate 400 to seal up the groove 401. A gap between the substrate 400, the semiconductor die stack 410 and the cover plate 420 is not filled with a filler. The package provided by the present disclosure has a lower package thickness, which satisfies the requirement for ultra-thin package, and does not cause deformation of the substrate due to difference between thermal expansion coefficients. Therefore, the package has high reliability.

What is claimed is:

1. A method for packaging a semiconductor, comprising:
 providing a substrate wafer, the substrate wafer having a first surface and a second surface arranged opposite to each other, the first surface having a plurality of grooves, wherein a first plurality of electrically conductive pillars are provided at a bottom of at least one of the plurality of grooves, and the first plurality of electrically conductive pillars penetrate through the bottom of the one of the plurality of grooves to the second surface;
 providing a plurality of semiconductor die stacks in the plurality of grooves such that one of the plurality of semiconductor die stacks is provided in a corresponding one of the plurality of grooves, wherein an upper surface of the one of the plurality of semiconductor die stacks is lower than an upper edge of the corresponding one of the plurality of grooves, and a bottom of the one of the plurality of semiconductor die stacks is electrically connected to the first plurality of electrically conductive pillars provided at the bottom of the corresponding groove; and covering a cover plate wafer on the first surface of the substrate wafer to seal up the plurality of grooves to form a semiconductor package structure;

wherein gaps among the substrate wafer, the plurality of semiconductor die stacks and the cover plate wafer are filled with air or vacuum;

wherein a surface of the cover plate wafer facing toward the substrate wafer has a second plurality of electrically conductive pillars, one of the second plurality of electrically conductive pillars is electrically connected to the upper surface of the corresponding semiconductor die stack;

wherein the cover plate wafer and the substrate wafer are attached by a bonding process, such that the plurality of grooves is sealed up, and wherein the plurality of grooves is sealed up by use of the cover plate wafer.

2. The method for packaging a semiconductor according to claim 1, wherein the second surface of the substrate wafer has a plurality of electrically conductive blocks, wherein one of the plurality of electrically conductive blocks is electrically connected to a corresponding first plurality of electrically conductive pillar.

3. The method for packaging a semiconductor according to claim 1, further comprising a method of forming one of the plurality of grooves on the substrate wafer including:
planarizing the first surface of the substrate wafer; and
removing a part of the substrate wafer from the first surface until the first plurality of electrically conductive pillar is exposed to form the groove.

4. The method for packaging a semiconductor according to claim 3, wherein the substrate wafer has dicing lanes, and the dicing lanes are used for alignment to form the groove.

5. The method for packaging a semiconductor according to claim 1, wherein each of the plurality of semiconductor die stacks is formed by stacking a plurality of semiconductor dies electrically connected to each other, the plurality of semiconductor dies being electrically connected to the first plurality of electrically conductive pillars provided at the bottom of the corresponding groove through the bottom of the plurality of semiconductor die stacks.

6. The method for packaging a semiconductor according to claim 5, wherein the plurality of semiconductor dies are electrically connected to each other through a third plurality of electrically conductive pillars penetrating through each of the plurality of semiconductor dies and a plurality of electrically conductive blocks between adjacent semiconductor dies.

7. The method for packaging a semiconductor according to claim 1, wherein the bottom of the corresponding semiconductor die stack is electrically connected to the first plurality of electrically conductive pillars penetrating through the bottom of the corresponding groove through a plurality of electrically conductive blocks provided at the bottom of the corresponding groove.

8. The method for packaging a semiconductor according to claim 1, wherein after sealing up the plurality of grooves, the method further comprises: dicing the semiconductor package structure along gaps between the plurality of grooves to form a plurality of packages independent of each other.

9. A semiconductor package structure, comprising:
a substrate wafer having a first surface and a second surface arranged opposite to each other, the first surface having a plurality of grooves, wherein a first plurality of electrically conductive pillars are provided at a bottom of at least one of the plurality of grooves, and the first plurality of electrically conductive pillars penetrate through the bottom of the one of the plurality of grooves to the second surface of the substrate wafer;

a plurality of semiconductor die stacks placed in the plurality of grooves such that one of the plurality of semiconductor die stacks is provided in a corresponding one of the plurality of grooves, wherein an upper surface of one of the plurality of semiconductor die stacks is lower than an upper edge of the corresponding one of the plurality of grooves, and a bottom of the one of the plurality of semiconductor die stacks is electrically connected to the first plurality of electrically conductive pillars provided at the bottom of the corresponding groove; and a cover plate wafer covering the first surface of the substrate wafer to seal up the plurality of grooves, wherein gaps among the substrate wafer, the plurality of semiconductor die stacks and the cover plate wafer are filled with air or vacuum;

wherein a surface of the cover plate wafer facing toward the substrate wafer has a second plurality of electrically conductive pillars, one of the second plurality of electrically conductive pillars is electrically connected to the upper surface of the corresponding semiconductor die stack;

wherein the cover plate wafer and the substrate wafer are attached by a bonding process, such that the plurality of grooves is sealed up, and wherein the plurality of grooves is sealed up by use of the cover plate wafer.

10. The semiconductor package structure according to claim 9, wherein the second surface of the substrate wafer has a plurality of electrically conductive blocks, wherein one of the plurality of electrically conductive blocks is electrically connected to a corresponding first plurality of electrically conductive pillar.

11. The semiconductor package structure according to claim 9, wherein each of the plurality of semiconductor die stacks is formed by stacking a plurality of semiconductor dies electrically connected to each other, the plurality of semiconductor dies being electrically connected to the first plurality of electrically conductive pillars provided at the bottom of the corresponding groove through the bottom of the plurality of semiconductor die stacks.

12. The semiconductor package structure according to claim 11, wherein the plurality of semiconductor dies are electrically connected to each other through a third plurality of electrically conductive pillars penetrating through each of the plurality of semiconductor dies and a plurality of electrically conductive blocks between adjacent semiconductor dies.

13. The semiconductor package structure according to claim 9, wherein the bottom of the corresponding semiconductor die stack is electrically connected to the first plurality of electrically conductive pillars penetrating through the bottom of the corresponding groove through a plurality of electrically conductive blocks provided at the bottom of the corresponding groove.

14. A package, comprising:
a substrate having a first surface and a second surface arranged opposite to each other, the first surface having a plurality of grooves, wherein a first plurality of electrically conductive pillars are provided at a bottom of at least one of the plurality of grooves, and the first plurality of electrically conductive pillars penetrate through the bottom of the one of the plurality of grooves to the second surface of the substrate;

at least one semiconductor die stack placed in the groove, wherein an upper surface of semiconductor die stack is lower than an upper edge of a corresponding one of the plurality of grooves, and a bottom of one of plurality of semiconductor die stacks is electrically connected to the first plurality of electrically conductive pillars provided at the bottom of the one of the plurality of grooves; and a cover plate covering the first surface of the substrate to seal up the plurality of grooves, wherein gaps among the substrate, the at least one semiconductor die stack and the cover plate are filled with air or vacuum;

wherein a surface of the cover plate wafer facing toward the substrate wafer has a second plurality of electrically conductive pillars, one of the plurality of electrically conductive pillars is electrically connected to the upper surface of the corresponding semiconductor die stack;

wherein the cover plate wafer and the substrate are attached by a bonding process, such that the plurality of grooves is sealed up, and wherein the plurality of grooves is sealed up completely by use of the cover plate wafer.

\* \* \* \* \*